(12) United States Patent
Wieczorek et al.

(10) Patent No.: US 7,419,867 B2
(45) Date of Patent: Sep. 2, 2008

(54) CMOS GATE STRUCTURE COMPRISING PREDOPED SEMICONDUCTOR GATE MATERIAL WITH IMPROVED UNIFORMITY OF DOPANT DISTRIBUTION AND METHOD OF FORMING THE STRUCTURE

(75) Inventors: Karsten Wieczorek, Dresden (DE);
Manfred Horstmann, Duerrroehrsdorf-Dittersbach (DE);
Thomas Feudel, Radebeul (DE)

(73) Assignee: Advanced Micro Devices, Inc., Austin, TX (US)

( * ) Notice: Subject to any disclaimer, the term of this patent is extended or adjusted under 35 U.S.C. 154(b) by 377 days.

(21) Appl. No.: 11/154,878

(22) Filed: Jun. 16, 2005

(65) Prior Publication Data
US 2006/0094183 A1   May 4, 2006

(30) Foreign Application Priority Data
Oct. 29, 2004   (DE)   .................. 10 2004 052 581

(51) Int. Cl.
*H01L 21/8238*   (2006.01)

(52) U.S. Cl. ................. 438/232; 438/275; 257/E21.637

(58) Field of Classification Search ................. 438/232, 438/275, 532; 257/E21.637
See application file for complete search history.

(56) References Cited

U.S. PATENT DOCUMENTS

| | | | |
|---|---|---|---|
| 4,692,783 A | 9/1987 | Monma et al. | 357/42 |
| 6,258,643 B1 | 7/2001 | Hsu | 438/199 |
| 6,528,858 B1 * | 3/2003 | Yu et al. | 257/493 |
| 6,566,181 B2 | 5/2003 | Bevk | 438/199 |
| 6,670,226 B2 | 12/2003 | Lin et al. | 438/199 |
| 2004/0046214 A1 | 3/2004 | Ishigaki et al. | 257/393 |

FOREIGN PATENT DOCUMENTS

| | | |
|---|---|---|
| EP | 0 899 784 A2 | 3/1999 |
| EP | 1 111 686 A1 | 6/2001 |

* cited by examiner

*Primary Examiner*—Chandra Chaudhari
(74) *Attorney, Agent, or Firm*—Williams, Morgan & Amerson

(57) ABSTRACT

By predoping of a layer of deposited semiconductor gate material by incorporating dopants during the deposition process, a high uniformity of the dopant distribution may be achieved in the gate electrodes of CMOS devices subsequently formed in the layer of gate material. The improved uniformity of the dopant distribution results in reduced gate depletion and reduced threshold voltage shift in the transistors of the CMOS devices.

24 Claims, 6 Drawing Sheets

CMOS GATE STRUCTURE COMPRISING PREDOPED SEMICONDUCTOR GATE MATERIAL WITH IMPROVED UNIFORMITY OF DOPANT DISTRIBUTION AND METHOD OF FORMING THE STRUCTURE

BACKGROUND OF THE INVENTION

1. Field of the Invention

The present invention generally relates to the fabrication of integrated circuits, and, more particularly, to the manufacture of CMOS gate structures comprising a predoped gate material, such as a predoped polysilicon, with an improved uniformity of the dopant distribution.

2. Description of the Related Art

The fabrication of integrated circuits requires the formation of a huge number of circuit elements on a given chip area according to a specified circuit layout. Generally, a plurality of process technologies are currently practiced, wherein, for logic circuitry, such as microprocessors, storage chips and the like, CMOS technology is currently the most promising approach, due to the superior characteristics in view of operational speed and/or power consumption. In this technology, millions of complementary transistors, i.e., N-channel transistors and P-channel transistors, are formed on an appropriate substrate, wherein the ongoing demand for an improved circuit functionality at a maintained chip area or a reduction of chip area while maintaining circuit functionality forces the present trend of scaling transistor dimensions and has additionally rendered transistors with a moderately low ratio of width and length, also referred to herein as narrow width devices, a preferred circuit element for highly advanced CMOS devices. The corresponding reduction of transistor width and length enables a significant reduction of the required chip area of advanced transistor circuit elements, thereby allowing a device functionality and/or chip size that may not be achieved with conventional CMOS devices having a high width/length ratio.

MOS transistors are formed in and on semiconductor regions of a substrate. The regions are separated from adjacent circuit elements by surrounding isolation structures. A typical MOS transistor comprises PN junction regions that are separated from each other by a channel region, which is controlled by a gate electrode formed above the channel region and separated therefrom by a thin insulating layer. The dimension of the channel region corresponding to the distance between the two PN junction regions, which are also referred to as the drain region and the source region, is denoted as channel length and represents the dominant design characteristic of the MOS transistor. The channel width is the dimension of the channel in the substrate plane in the direction perpendicular to the length direction. The channel width is determined by the spacing between the isolation structures in this direction.

By reducing the channel length and width of the transistor, not only the transistor size but also the functional behavior thereof may be specifically designed to obtain a desired transistor performance. The channel length is associated with the gate length and may, in typical MOS transistors, be less than the gate length since the source and drain extension typically extends marginally below the gate electrode. The channel width is substantially identical to the gate width. Presently, a gate length of approximately 0.1 µm and significantly less may be encountered in advanced CMOS devices with corresponding clock frequencies of 2000 MHz and more. A typical gate width of an advanced MOS transistor extends to approximately 0.5 µm or less.

Although the continuous size reduction of transistor elements has provided for significant advantages in view of performance and/or power consumption, a plurality of issues has to be addressed so as to not unduly offset some of the advantages that are offered by the reduced dimensions of the circuit elements. Especially the fabrication of the circuit components having the critical dimensions, such as the gate electrode of the transistor element substantially determining the channel length, requires huge efforts to reliably and reproducibly form these tiny circuit components. For instance, it is an extremely complex process to form gate electrodes having a gate length that is well below the wavelength of the UV radiation used to transfer a layout image from a reticle to a resist layer formed on the substrate. In narrow width transistors, having a substantially reduced channel area, additionally, edge effects at the channel/isolation structure interface, such as edge leakage current and threshold voltage shift, become significant and have to be precisely controlled.

A further difficulty arises from the fact that the PN junctions are defined by dopant profiles that are, at least partially, created by ion implantation and subsequent anneal cycles. Since, typically, reduced feature sizes require higher dopant concentrations to compensate for the reduced conductivity owing to reduced cross-sectional areas, complex implantation cycles are required, wherein the vertical and lateral dopant profile has to be precisely controlled to achieve the desired transistor performance. Since the dopants implanted are subjected to diffusion upon elevated temperatures of the device during the manufacturing processes, very strict requirements have to be met with respect to a thermal budget that describes the diffusivity of the dopants over time. In conventional process technologies, the source/drain implantation is also supplied to the gate electrode acting as an implantation mask during the implant cycles. A reduced transistor gate length also requires extremely shallow PN junctions in order to maintain the required controllability of the channel conductivity. Thus, the doping levels and profiles required in the drain and source regions of advanced transistor elements may necessitate implant processes that may be insufficient to achieve the required conductivity of the polysilicon gate electrode. Moreover, due to the non-uniform dopant distribution of these drain/source implantations, the resulting dopant concentration in the polysilicon gate may not be appropriate for preventing undesired gate charge carrier depletion during transistor operation.

To overcome this problem, a polysilicon predoping process is performed after deposition of the polysilicon gate layer and prior to the gate patterning step. The polysilicon predoping is typically performed by ion implantation and needs to go along with sufficient penetration margin to avoid penetration of dopants through the gate oxide, which otherwise may cause severe radiation damage to the ultra-thin insulation layer. The required penetration margin, however, may result in an undesired dopant distribution in the thickness direction of the polysilicon gate layer. Subsequently performed thermal annealing steps may drive the dopants towards the gate oxide to improve the dopant distribution uniformity but may, for advanced transistors, due to the low thermal budget requirements, not provide the desired distribution uniformity.

Another problem arises from the fact that ion implantation is typically performed by a scanning process. The ion beam impinges approximately perpendicular on the surface of a center region of an aligned substrate, whereas an angle of incidence of the ion beam in an edge region of the substrate in the range of approximately 80-85 degrees may be encountered. The tilted implantation, however, may deteriorate the dopant distribution uniformity in the edge region of the substrate due to shadowing effects caused by, for instance, substrate topography at this stage of manufacture, which may result in an undesired shift of the threshold voltage of transistors formed in the edge region of the substrate.

With reference to FIGS. 1a-1d and 2a-2e, a typical conventional process flow for forming a predoped polysilicon CMOS gate structure for wide width and narrow width (FIG. 2e) transistors will now be described to discuss some of the problems involved in predoping by ion implantation at a center region of a substrate (FIGS. 1a-1d) and at a edge region of a substrate (FIGS. 2a-2e) in more detail. FIGS. 1a-1d and 2b-2e show sectional views of the gate structure in the width direction, i.e., the width direction is in the drawing plane. In FIGS. 1a-1d and 2a-2e, similar or identical components are denoted by the same reference numeral except for the very first digit, which is selected in correspondence with the number of the respective figure.

In FIG. 1a, a CMOS gate structure 100 comprises a substrate 101 comprising N-doped and P-doped crystalline silicon regions 107, 109. A layer of semiconductor gate material 105, which is formed above the silicon regions 107, 109, is separated therefrom by gate insulation layers 113, 115. The layer of semiconductor gate material 105 is typically comprised of polysilicon and the gate insulation layer may be comprised of silicon dioxide, silicon oxynitride and the like. Isolation structures 103 substantially define the dimensions of the N-doped and P-doped crystalline silicon regions 107, 109 and electrically insulate the regions 107, 109 from neighboring circuit elements.

A typical process flow for forming the CMOS gate structure 100 in a center region of a substrate as depicted in FIG. 1a may include the following processes. The substrate 101, typically a silicon substrate, is provided. Thereafter, the isolation structure 103 is formed, for example, of silicon dioxide using well-established photolithography, etch, deposition and polishing techniques. A final wet etch process performed after the polishing step to remove an employed polishing stop layer (not shown) may result in a corresponding substrate topography due to the different etch rates of silicon and silicon oxide. In addition, a well implantation that may comprise several implantation steps with different ion species and different implantation energies is performed to generate a desired well dopant profile in the semiconductor regions 107, 109, for example, a retrograde profile. Thereafter, a thin dielectric layer having the required characteristics for the gate insulation layers 113, 115 may be formed by, for instance, advanced oxidation and/or deposition processes. The polysilicon layer 105 is then formed on the thin dielectric layer by deposition techniques that are well known in the art, for example, by low pressure chemical vapor deposition (LPCVD). The LPCVD process shows a substantially conformal deposition characteristic so that the surface of the deposited polysilicon layer 105 exhibits substantially the topography of the substrate 101 previously structured in the isolation structure forming process.

FIG. 1b schematically shows the CMOS gate structure 100 after the formation of a mask element 111 covering at least the polysilicon layer 105 over the crystalline silicon region 107. The mask element 111 may be formed by patterning a spun-on photoresist layer by means of well-established photolithography and anisotropic etch processes. The patterned resist layer may be formed with an appropriate thickness that provides the required ion blocking effect in the subsequent ion implantation step 120. In the implantation step 120, an N-doped polysilicon region, denoted as 119, is formed by implanting a pentavalent ion species such as, for example, phosphorous or arsenic. In the center region of the substrate 101, the ions impinge on the surface of the substrate 101 substantially perpendicularly to the surface plane. The implant energy is chosen to observe a sufficient penetration margin 118 to avoid penetration of dopants through the gate insulation layer 115. The typical implant energy is on the order of several keV. A thermal annealing step may be performed after the implantation step 120 to drive the dopants towards the gate insulation layer 115 based on the allowed thermal budget with respect to the above-described well profile requirements.

FIG. 1c schematically shows the CMOS gate structure 100 after removal of resist mask element 111 and after the formation of a further mask element 121 covering at least the N-doped polysilicon region 119. The mask element 121 may be formed as noted before with respect to mask element 111. The implantation step 122 may also be performed with an observed penetration margin 116 similar to the implantation step 120 described before but with a trivalent ion species such as, for example, boron or indium, instead of the pentavalent ion species.

FIG. 1d schematically shows the CMOS gate structure 100 after the completion of the implantation step 122 and after the removal of the resist mask element 121. The predoped polysilicon layers 117, 119, exhibiting a non-uniform dopant distribution and being N-doped over the P-doped silicon region 109 and being P-doped over the N-doped silicon region 107, are subjected to a patterning process to form correspondingly doped gate electrodes 177, 179 over the semiconductor regions 107, 109 respectively.

FIGS. 2a-2e illustrate the corresponding implantation process for an edge region of the substrate 201. In FIG. 2a, a side view of the substrate 201 subjected to a scanning implantation process is provided. When the ion beam is deflected to sweep along a line on the substrate, the angle of incidence is varied depending on the distance of the point of incidence from the substrate center. While the ions impinge substantially perpendicular to the surface plane of the substrate at a center region of the substrate, an angle of incidence 204 in the range of 80-85 degrees may be encountered in commercially available implantation tools for edge regions of substrates 201 having a diameter of 200 mm. For 300 and 400 mm substrates, intended for future industrial application, the angle of incidence 204 may be further decreased. The effect of the tilted implantation in the edge region of the substrate on the dopant distribution of the polysilicon layer 205 is illustrated in FIGS. 2b-2e.

FIG. 2b shows a CMOS gate structure 200 like the CMOS gate structure 100 of FIG. 1b but formed in an edge region of the substrate 201 so that, as noted above, a tilted implantation is performed. Due to shadowing effects, caused by the substrate topography, a region with reduced dopant concentration may be formed in the region 219. The region 219 may even be affected more severely from shadowing effects when the CMOS structure is oriented as shown in FIG. 2b so that the resist mask element 211 is also contributing to the shadowing effect resulting in the shadowed region 210. The region 210 further also indicates the region of lower dopant concentration caused by the above-mentioned implantation margin. It is further to be noted that the dashed line defining the region 210 does not indicate a sharp junction but a gradual transition.

FIG. 2c schematically shows the CMOS gate structure 200 after removal of resist mask element 211 and after the formation of a resist mask element 221. The tilted P-dopant implantation 222 over the N-doped silicon region is again adversely affected by shadowing caused by the substrate topography. In the depicted case, there is no shadowing caused by the resist mask element 221. It is to be mentioned that, for a CMOS gate structure formed with the same orientation on the opposite edge of the substrate 201, the resist mask related shadowing effect may affect the P-doped polysilicon region 217. Furthermore, shadowing in the P-doped polysilicon region 217 may be caused by a resist mask element disposed on an adjacent CMOS gate structure (not shown).

FIG. 2d schematically shows the CMOS gate structure 200 after removal of the resist mask element 221. The predoped polysilicon layers 217, 219 are subjected to a patterning process, as noted before with respect to FIG. 1d, to form correspondingly doped gate electrode structures 277, 279 over the semiconductor regions 207, 209 respectively. In contrast to the dopant distribution of FIG. 1d, the obtained non-uniformity of the dopant distribution in the edge region of the gate electrodes 277, 279 is further increased due to the shadowing effects. Thus, wide width CMOS transistors which may be formed from the CMOS gate structure 200 may exhibit threshold voltage ($V_t$) shifts affecting the edge of the transistor.

FIG. 2e schematically shows the corresponding CMOS gate structure 200 for narrow width transistors. Due to the reduced width of narrow width transistors, the occurring implantation shadowing effects affect a substantial portion of the predoped polysilicon layers 217, 219. In narrow width transistors, the edge effect may significantly affect the device characteristics of the narrow width transistor, resulting in a non-uniformity of device characteristics of devices formed on different substrate locations, thereby negatively affecting production yield.

In view of the situation identified, there exists a need for an improved technique that enables the further scaling of CMOS transistors, particularly of narrow width transistors, while reducing or avoiding one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present invention is directed to a technique that enables the formation of predoped semiconductor CMOS gate electrode structures having a dopant distribution of improved uniformity.

According to one illustrative embodiment of the present invention, a method for forming a CMOS gate electrode structure comprises depositing a first layer of semiconductor gate material comprising at least a first dopant at least over a first gate insulation layer formed above a first semiconductor region, and depositing a second layer of semiconductor gate material comprising at least a second dopant other than said first dopant at least over a second gate insulation layer formed above a second semiconductor region. The method further comprises patterning the first and second layer of semiconductor gate material and the first and second gate insulation layer to form first and second gate electrode structures.

According to another illustrative embodiment of the present invention, a method for forming a CMOS device comprises providing a substrate comprising at least one N-type semiconductor region and at least one P-type semiconductor region surrounded and separated by dielectric isolation structures. The method further comprises forming a first gate insulation layer on the at least one N-type semiconductor region, and forming a second gate insulation layer on the at least one P-type semiconductor region. The method further comprises depositing a first layer of semiconductor gate material comprising at least one P-dopant at least over the first gate insulation layer, and depositing a second layer of semiconductor gate material comprising at least one N-dopant at least over the second gate insulation layer. The method further comprises patterning the first and second layer of semiconductor gate material and the first and second gate insulation layer, and forming first source and drain regions in the at least one N-type semiconductor region and forming second source and drain regions in the at least one P-type semiconductor region.

According to still another illustrative embodiment of the present invention, a CMOS device comprises a substrate comprising at least one N-type semiconductor region and at least one P-type semiconductor region surrounded and separated by dielectric isolation structures. The CMOS device further comprises a first gate insulation layer disposed on the at least one N-type semiconductor region and a second gate insulation layer disposed on the at least one P-type semiconductor region. The CMOS device further comprises a first gate electrode comprising semiconductor material incorporating a P-dopant, the first gate electrode being at least partially disposed over the first gate insulation layer, wherein the P-dopant in a first lower gate region, located adjacent to the interface of the first gate electrode and the first gate insulation layer, is substantially uniform, and wherein the thickness of the first lower gate region is approximately 10 nm, and a second gate electrode comprising semiconductor material incorporating an N-dopant, the second gate electrode being at least partially disposed over the second gate insulation layer, wherein the N-dopant in a second lower gate region, located adjacent to the interface of the second gate electrode and the second gate insulation layer, is substantially uniform, and wherein the thickness of the second lower gate region is approximately 10 nm. The CMOS device further comprises first source and drain regions disposed at least partially in the at least one N-type semiconductor region adjacent to the first gate electrode, and second source and drain regions disposed at least partially in the at least one P-type semiconductor region adjacent to the second gate electrode.

According to yet another illustrative embodiment of the present invention, a CMOS device comprises a substrate comprising at least one N-type semiconductor region and at least one P-type semiconductor region surrounded and separated by dielectric isolation structures. The CMOS device further comprises a first gate insulation layer disposed on the at least one N-type semiconductor region, and a second gate insulation layer disposed on the at least one P-type semiconductor region. The CMOS device further comprises a first gate electrode comprising semiconductor material incorporating a P-dopant, the first gate electrode being at least partially disposed over the first gate insulation layer, and a second gate electrode comprising semiconductor material incorporating an N-dopant, the second gate electrode being at least partially disposed over the second gate insulation layer. The CMOS device further comprises first source and drain regions disposed at least partially in the at least one N-type semiconductor region adjacent to the first gate electrode, and second source and drain regions disposed at least partially in the at least one P-type semiconductor region adjacent to the second gate electrode, wherein a dopant distribution of at least one of the N-dopant in the first gate electrode and the P-dopant in the second gate electrode is substantially uniform.

BRIEF DESCRIPTION OF THE DRAWINGS

The invention may be understood by reference to the following description taken in conjunction with the accompanying drawings, in which like reference numerals identify like elements, and in which.

Figure 1A:
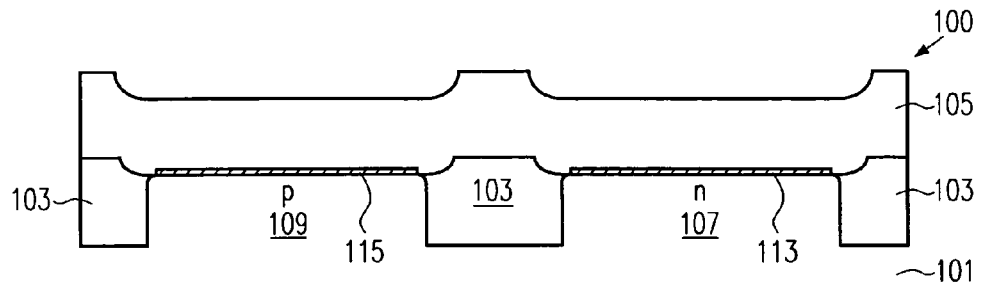
FIGS. 1a-1d schematically show cross-sectional views of a CMOS gate electrode structure formed in the center region of a substrate according to the prior art.
Figure 1B:
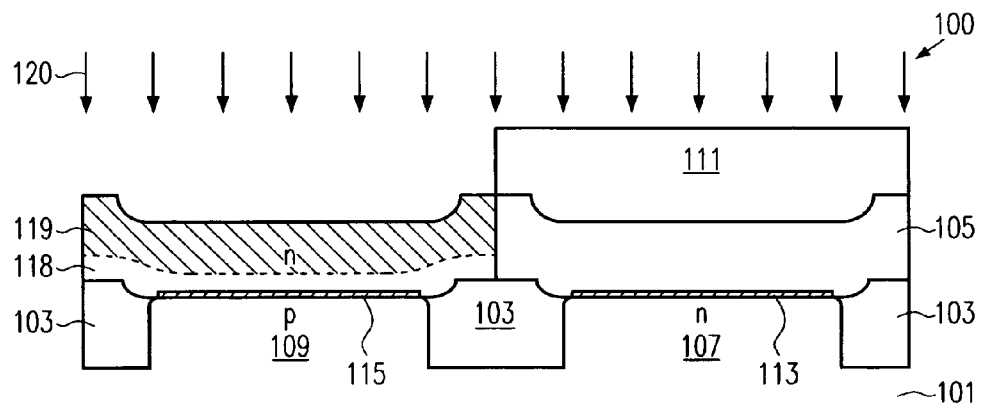
Figure 1C:
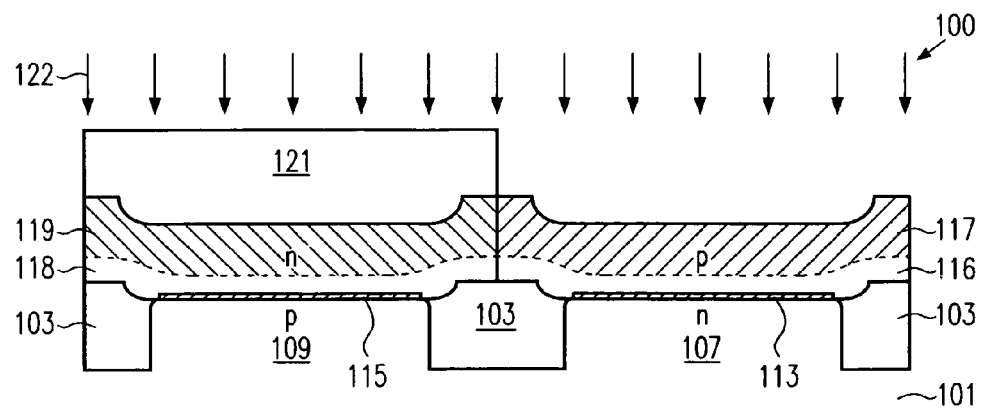
Figure 1D:
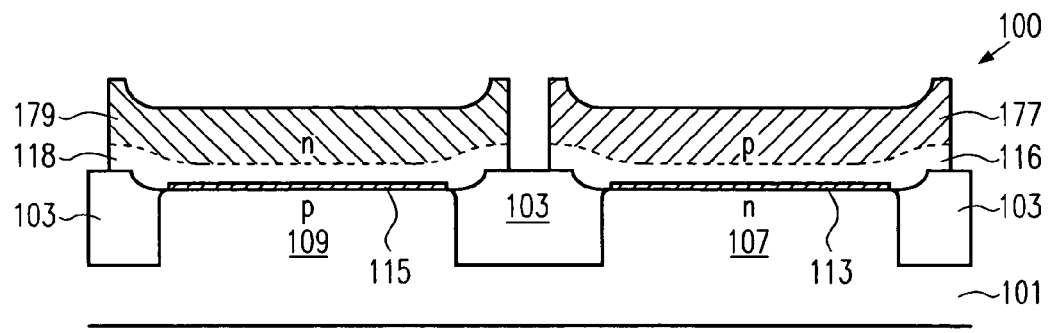
Figure 2A:
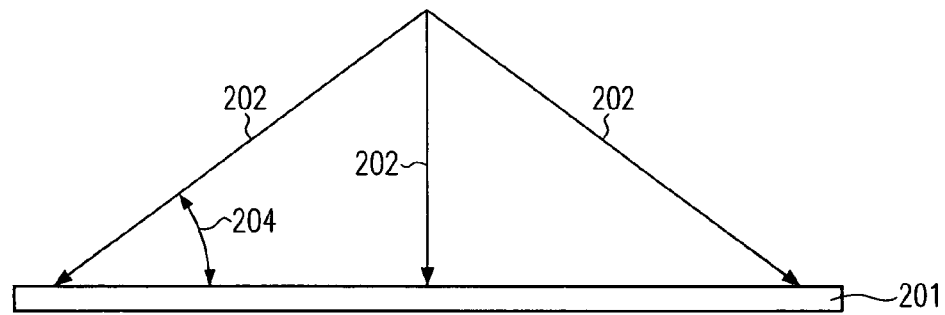
FIGS. 2a-2e schematically show cross-sectional views of a CMOS gate electrode structure formed in the edge region of a substrate according to the prior art.
Figure 2B:
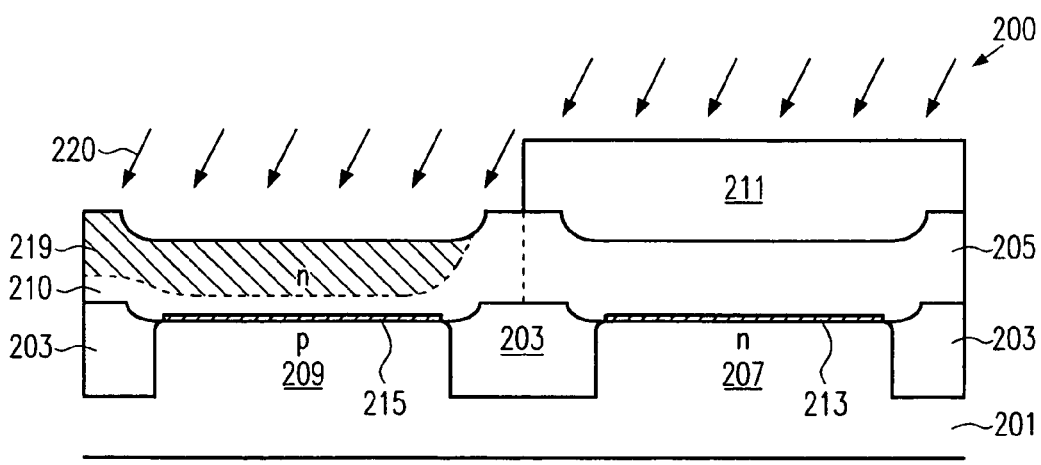
Figure 2C:
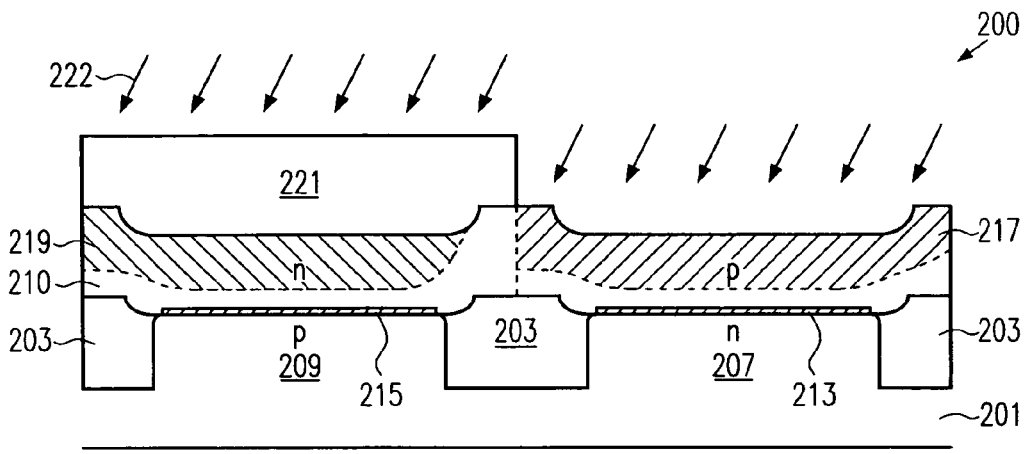
Figure 2D:
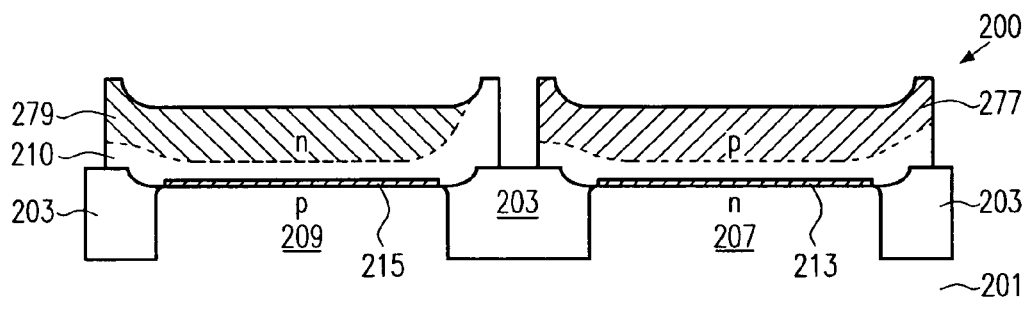
Figure 2E:
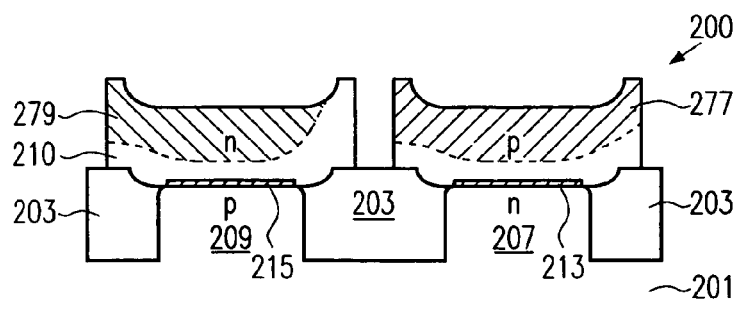

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

In the following detailed description of further illustrative embodiments of the present invention, a CMOS gate structure for narrow width transistor elements is referred to, since this circuit architecture is presently considered the most promising candidate for manufacturing advanced ULSI-CMOS devices. It should be appreciated, however, that the principles of the present invention may readily be applied to conventional wide width transistor devices. The described CMOS gate structures are formed on bulk semiconductor substrates, but may also be formed on silicon-on-insulator (SOI) substrates. The semiconductor material may comprise, for example, silicon, germanium, silicon/germanium or any other appropriate III-V or II-VI semiconductors, and the carrier portion of the substrate may be glass, sapphire and the like. Consequently, the present invention should not be considered as being restricted to narrow width transistor elements on bulk silicon substrates unless such restrictions are explicitly set forth in the appended claims.

With reference to FIGS. 3a-3e, further illustrative embodiments will now be described in more detail. It should be noted that components similar or identical to those shown in FIGS. 1a-1d and 2a-2e are denoted by the same reference numeral except for the very first digit, which is selected in correspondence with the number of the respective figure.

Figure 3A:
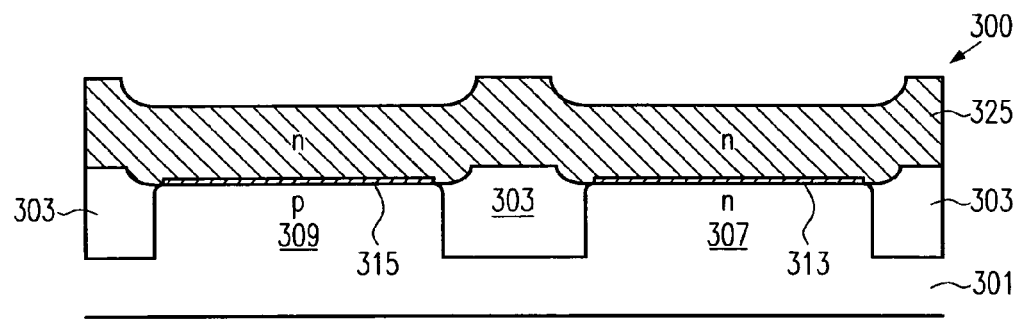
FIGS. 3a-3g schematically show cross-sectional views of a narrow width CMOS gate electrode structure formed according to the present invention.

In FIG. 3a, a narrow width CMOS gate structure 300 comprises a semiconductor substrate 301, for instance in the form of a bulk silicon substrate. The substrate 301 comprises N-doped and P-doped crystalline semiconductor regions 307, 309 which may comprise, for example, silicon or silicon/germanium, and may be strained to improve the charge carrier mobility therein. Isolation structures 303, comprised of an insulating material, such as silicon dioxide and/or silicon nitride, define the dimensions of the N-doped and P-doped crystalline silicon regions 307, 309 and insulate the regions 307, 309 electrically from neighboring circuit elements. A layer of N-doped semiconductor gate electrode material 325, which is formed above the silicon regions 307, 309, is separated therefrom by gate insulation layers 313, 315. The layer of semiconductor gate electrode material 325 may be, for example, comprised of polysilicon or silicon/germanium, and the gate insulation layer may be comprised of silicon dioxide, silicon oxynitride, high-k dielectrics and the like.

A typical process flow for forming the CMOS gate structure 300 as depicted in FIG. 3a may include the following process steps. After providing the substrate 301, the isolation structure 303 may be formed by well-established lithography, anisotropic etch, deposition and polish techniques. The corners at the edges of the crystalline silicon regions 307, 309 may be rounded in the process forming the isolation structures 303 by thermal oxidation to minimize detrimental edge effects. A final wet etch process performed after the polishing step to remove an employed polishing stop layer (not shown) may be performed. In addition, a well implantation sequence that may comprise several implantation steps with different ion species and/or different implantation energies may be performed to generate a desired well dopant profile in the semiconductor regions 307, 309, for example, a retrograde well profile. Thereafter, a thin dielectric layer having the required characteristics for the gate insulation layers 313, 315 may be formed, for instance, by advanced oxidation and/or deposition processes. The layer of N-doped semiconductor gate electrode material 325 is then blanket deposited on the substrate 301 by deposition techniques that are well known in the art, for instance, by chemical vapor deposition (CVD), for instance, low pressure chemical vapor deposition (LPCVD). The layer of N-doped semiconductor material may comprise N-doped polysilicon, wherein the N-dopant may, for instance, be phosphorous that may be incorporated by adding a phosphorous-containing gas, such as phosphine, to the polysilicon deposition process. The thickness of the layer of N-doped semiconductor gate electrode material 325 may be adapted to a desired thickness of a gate electrode, which is subsequently formed therefrom. The thickness of the layer as deposited may further take a certain over-polish behavior of a subsequently performed chemical mechanical polishing (CMP) step into account.

Figure 3B:
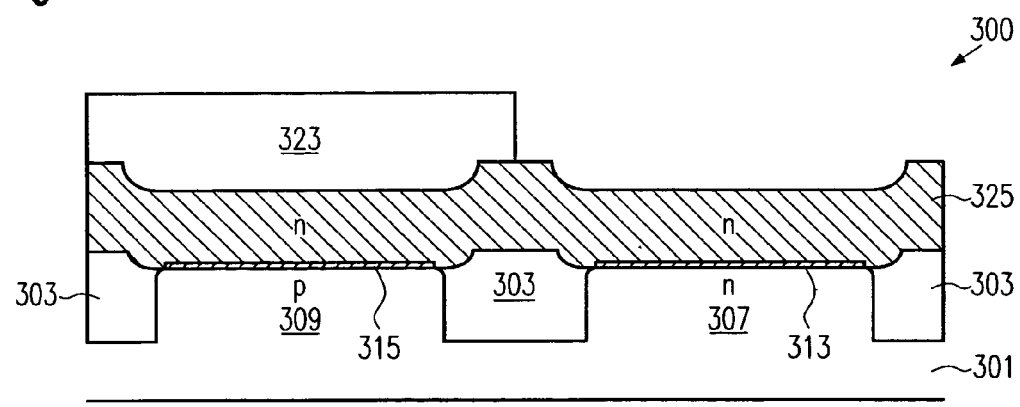

FIG. 3b schematically shows the structure 300 after the formation of an etch mask element 323 on the layer of N-doped semiconductor gate electrode material 325 at least over the P-doped semiconductor region 309 and over the corresponding insulation structure 303. The layer of N-doped semiconductor material 325 formed over the N-doped semiconductor region 307 and over the corresponding insulation structure 303 is exposed. The etch mask element 323 may be formed by well-known photolithography and an anisotropic etch process. The etch mask element 323 may be a resist mask element but any other mask material having the required etch selectivity, such as hard mask material, like silicon nitride, may be employed.

Figure 3C:
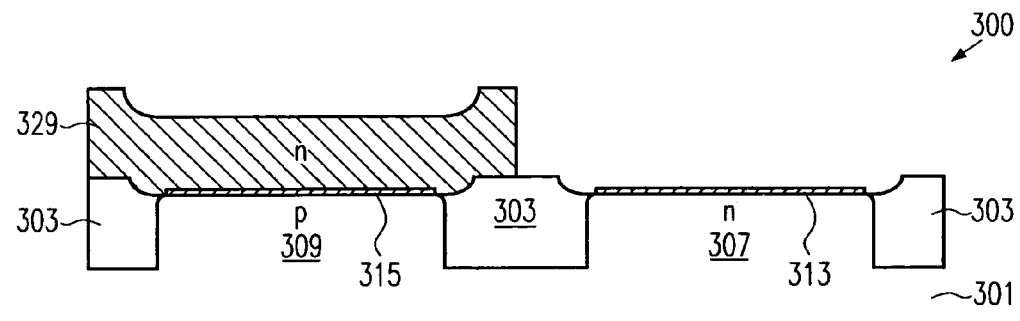

FIG. 3c schematically shows the structure 300 after completion of an etch process removing the exposed layer of N-doped semiconductor material 325 from gate insulation layer 313 and from the surrounding isolation structure 303. The exposed portion of the layer 325 may be removed by well-established dry or wet etch processes having the required etch selectivity with respect to the underlying gate insulation layer 313. It is to be noted that, in particular, dry etch processes may cause damage to the gate isolation layer 313 that may adversely affect the performance of the subsequently formed transistor element, in particular of advanced transistors with an extremely thin gate insulation layer 313. Thus, in one embodiment, the exposed portion of the layer 325 may be removed by a combination of dry and wet etch steps. Initially, an upper portion of the exposed layer 325 is removed by a dry reactive ion etch (RIE) process. A thin lower portion of the exposed layer 325 is maintained that may protect the gate insulation layer 313 from being damaged in the RIE process. The remaining thin lower portion may be removed subsequently in a highly isotropic etch process, such as a wet chemical process, providing the required etch selectivity without unduly damaging the gate insulation layer 313.

In a further embodiment, the gate insulation layer 313 is removed after removal of the exposed layer of N-doped semiconductor material 325 by a further etch process having the required selectivity with respect to the underlying semiconductor material. Thereafter, a new gate insulation layer is formed by wet chemical oxidation and/or by chemical vapor deposition (CVD).

The remaining portions of the layer of N-doped semiconductor material 325 form the N-doped region of gate electrode material 329. The mask element 323 is subsequently removed by well-known resist or hard mask removal processes.

Figure 3D:
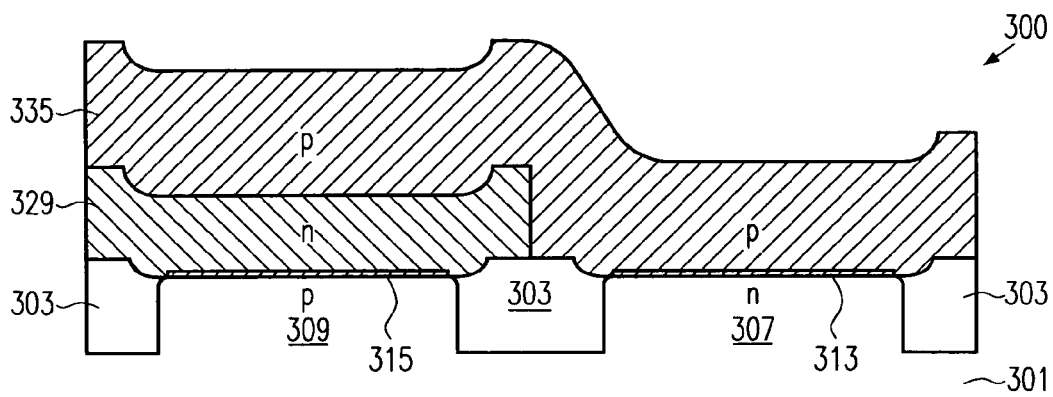

FIG. 3d schematically shows the structure 300 in a further advanced manufacturing stage. A layer of P-doped semiconductor gate electrode material 335 is blanket deposited on the substrate 301 by deposition techniques that are well established, for instance, by chemical vapor deposition (CVD), for instance by low pressure chemical vapor deposition (LPCVD). The layer of P-doped semiconductor material 335 may comprise P-doped polysilicon, and in one embodiment P-doped silicon/germanium, wherein the P-dopant may, for instance, be boron that may be incorporated by adding a boron-containing gas, such as diborane, to the polysilicon or silicon/germanium deposition process. A deposited boron doped silicon/germanium material exhibits a high active dopant concentration and may thus provide an enhanced gate conductivity even for crucial P-doped gate structures of advanced P-channel transistors. The dopant-containing precursor gas may be supplied during the entire gate material deposition process to provide a substantially uniform dopant profile in the thickness direction of the layer. The thickness of the deposited layer 335 may be adjusted with respect to a subsequent chemical mechanical polishing process (CMP) to compensate for a certain removal of material from the deposited layer 335 in the region over the semiconductor region 307.

In a further embodiment, the dopant-containing precursor gas supplied in the deposition process to form layer 325 and/or layer 335 may be supplied with a certain delay with respect to initiation of the deposition so that a thin undoped sub-layer (not shown) is formed to ensure that dopant diffusion into the gate insulation layers 313, 315 during the annealing steps performed subsequently in the CMOS device manufacturing sequence is substantially prevented. The thickness of the sub-layer may be adapted to the remaining thermal budget of the subsequently performed manufacturing sequence to allow driving the dopants close to the gate semiconductor/insulator interface while substantially avoiding the penetration of the insulation layer. Consequently, in advanced devices, the thickness of the sub-layer is in the range of approximately 1-5 nm.

After the deposition of the layer of P-doped semiconductor material 335, the N-doped semiconductor region 307 is covered with a single layer of P-doped semiconductor gate electrode material 335 and the P-doped semiconductor region 309 is covered with a layer stack comprised of N-doped semiconductor gate electrode material 329 and P-doped semi-conductor gate electrode material 335. It is to be noted that the sequence of the deposition processes for the N-doped and the P-doped layers of semiconductor gate electrode material shown in FIGS. 3a-3d may be changed so that the P-doped layer is deposited and patterned before the N-doped layer of semiconductor gate electrode material is blanket deposited. In both cases, the upper portion of the layer stack is subsequently removed. Thus, the substrate is subjected to a chemical mechanical polishing (CMP) process.

Figure 3E:
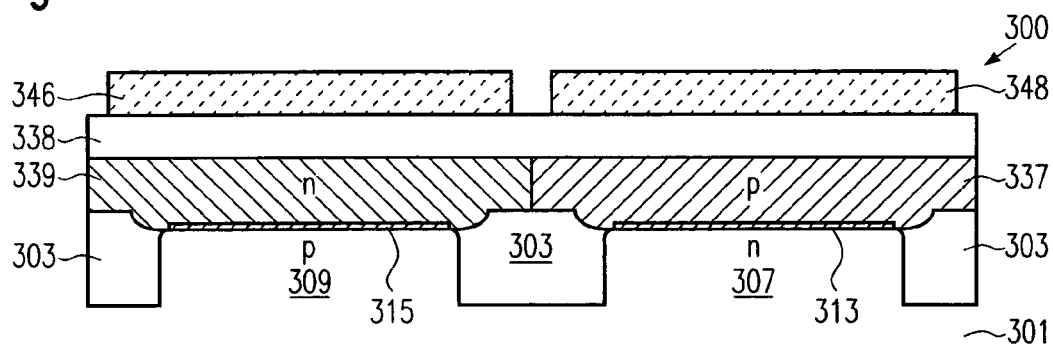

FIG. 3e schematically shows the structure 300 after completion of the CMP process. Corresponding CMP processes are well known and thus an illustration of the process may be omitted herein. The CMP process may be continued until the P-doped semiconductor gate electrode material 335 is completely removed from the layer of N-doped semiconductor gate electrode material 329, and a substantially flat surface is obtained. The flat surface may further improve the accuracy of the subsequent gate patterning process since advanced photolithography provides a rather small depth of focus that may be insufficient for the topography of the non-polished substrate. An anti-reflective coating (ARC) layer 338 may further be required in the photolithography step of the gate patterning process to establish the required light exposure conditions. The ARC layer 338 may comprise, for example, oxynitride and may be deposited on the polished surface by well known CVD methods. A resist mask 346, 348 is subsequently formed on the ARC layer 338 by well known processes. The performed CMP process may further serve to provide the polished layers of doped gate electrode material 337, 339 with an appropriate thickness for a gate electrode, wherein it is to be observed that, during subsequent manufacturing process steps, the thickness may be further reduced, for instance, in an etch process performed to remove the ARC layer 338.

Figure 3F:
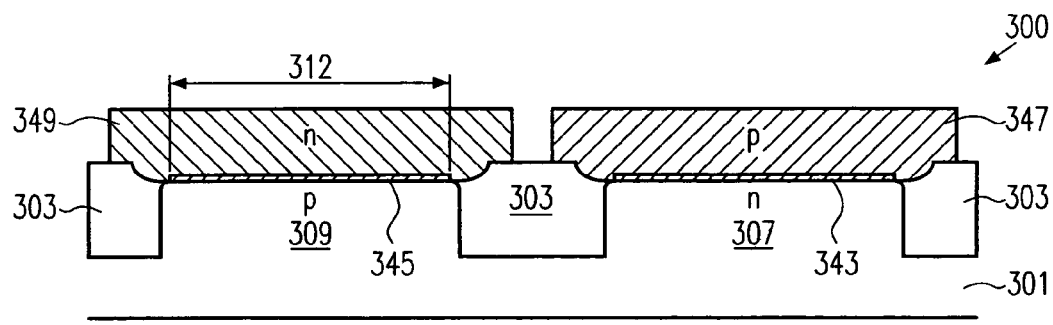

FIG. 3f schematically shows the structure 300 after completion of the gate electrode patterning process. The layer stack, comprising the layers of doped gate electrode material 337, 339, the gate insulation layers 313, 315, and possibly the ARC layer 338, is patterned by advanced photolithography and subsequent anisotropic etch processes to obtain the gate electrode structures 347, 349 and the gate insulation layers 343, 345 having the required gate length and width. The gate electrode structures 347, 349 span in the width direction across the entire semiconductor regions 307, 309 and extend partially over the isolation structure 303. The ARC layer 338 may be removed by a well-known selective etch process. The completed CMOS gate structure 300 comprises a substrate 301 and formed therein and thereon isolation structures 303, N-doped and P-doped crystalline semiconductor regions 307, 309, patterned gate isolation regions 343, 345 and patterned layers of N-doped and P-doped gate electrode material 347, 349 having the shape of a gate electrode. The gate width 312 may be approximately 500 nm or less, and, in an illustrative embodiment, the gate width 312 may be approximately 300 nm or less. The dopant distribution in the patterned layers of N-doped and P-doped gate electrode material 347, 349 is substantially uniform.

Figure 3G:
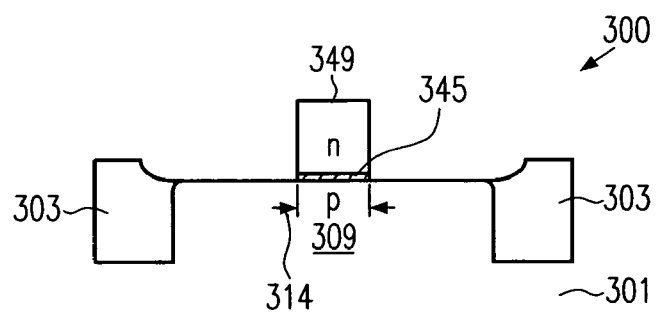

FIG. 3g schematically shows a sectional view of a portion of the CMOS gate structure 300 formed in and on the P-doped semiconductor region 309 in the length direction, i.e., contrary to the figures described above, the length direction is in the drawing plane. Due to the substantial uniform dopant distribution in the patterned layers of N-doped and P-doped gate electrode material 337, 339, the CMOS gate structure may serve to form advanced narrow width CMOS devices exhibiting an improved performance and having an improved controllability of the threshold voltage across the entire substrate. The gate length 314 may be approximately 100 nm or less. In a further embodiment, the gate length 314 may be approximately 70 nm or less.

Figure 4:
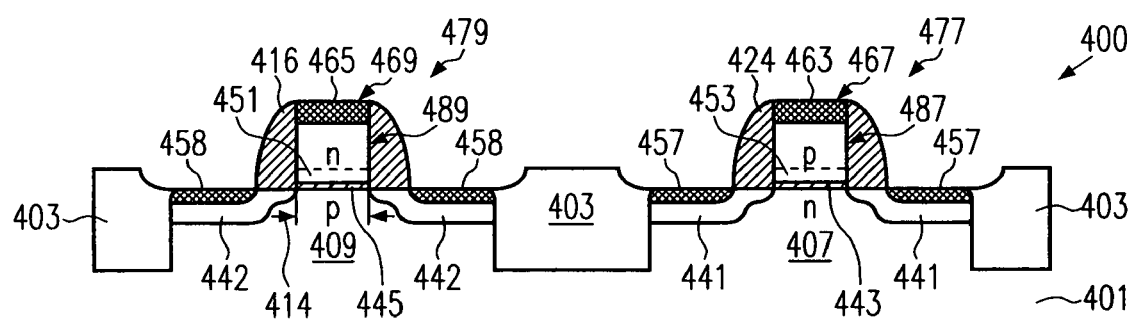
FIG. 4 schematically shows a cross-sectional view of a narrow width CMOS device formed according to the present invention.

With reference to FIG. 4, further illustrative embodiments relating to narrow width CMOS devices will now be described. It should be noted that components similar or identical to those shown in FIGS. 3a-3g are denoted by the same reference numeral except for the very first digit and a detailed description of these components and processes for the formation thereof may, therefore, be omitted.

FIG. 4 schematically depicts a sectional view of a CMOS device 400 with an N-channel transistor 479 and a P-channel transistor 477 in the length direction. The transistors 477,479 are formed from gate structures as described with respect to FIGS. 3a-3f. The transistors 477,479 comprise gate electrodes 467, 469 separated from the N-doped and P-doped semiconductor regions 407, 409 by the gate insulation layers 443, 445. Source and drain regions 441, 442 are formed in the semiconductor regions 407, 409. Source/drain metal silicide regions 457, 458 in turn are formed in the source and drain regions 441, 442. The gate electrodes 467, 469 comprise sidewall spacers 424, 416, gate metal silicide regions 463, 465 and a doped gate electrode region 487, 489 comprising a lower gate region 453, 451. Reference numeral 414 indicates the gate length of the N-channel transistor 479. The gate length 414 of the transistor may be approximately 100 nm or less, and, in an illustrative embodiment, the gate length 414 may be approximately 70 nm or less. To form the transistors continuing with the gate structures of FIG. 3f, a first ion implantation sequence may be carried out to form extensions of the dopant profile for the drain and source regions 441, 442, wherein the polysilicon gate electrode structure acts as an implantation mask. Thereafter, the sidewall spacers 424, 416 may be formed, depending on the process regime two or more spacers may be formed sequentially, and further ion implantation cycles are carried out to introduce the finally required dopant concentration into the drain and source regions 441, 442. Again, the same dopant dose is also provided to the gate electrode structure. Thereafter, anneal cycles are performed to activate dopants and to re-crystallize, at least partially, those portions of the drain and source regions 441, 442 that are damaged by the previous implantation sequences. Thereafter, when the CMOS device 400 is a silicon-based device, a silicidation process may be performed similarly as in conventional devices to increase the conductivity of the regions 457, 458 and of the gate electrode 467, 469. Since advanced MOS transistors require extremely shallow drain and source regions 441, 442, the source/drain implantation may affect only a shallow upper region of the gate electrode 467, 469, even after the performed annealing steps. Thus, a lower region 453, 451 may still provide a uniform dopant distribution. The silicidation process is performed as a self-aligned reaction of the silicon with a refractory metal, such as cobalt, a subsequent removal of non-reacted metal and a further anneal cycle to further convert the cobalt monosilicide in a stable and highly conductive cobalt disilicide, thereby forming gate metal silicide regions 463, 465 in the gate electrode 467, 469 and corresponding source/drain metal silicide regions 457, 458 in the drain and source regions 441, 442.

For manufacturing P-channel transistors, boron is frequently used as the dopant for forming the drain and source regions 441, 442, which exhibits a high diffusivity. Therefore, boron penetration into the gate insulation layer 443, 445 during the implantation and the subsequent anneal cycles may take place and may reduce the reliability of the gate insulation layer 443, 445, i.e., the long term resistance against electrical breakdown, may significantly drop. For extremely high boron doses, even the dopant concentration of the channel region formed between the drain and source regions 441, 442 may be negatively influenced. On the other hand, as advanced MOS transistors may require extremely shallow drain and source regions 441, 442, as noted before, the implantation may be carried out at low implantation energies and the dopants may not adversely affect the gate insulation layer and the underlying channel region but may result in an undue dopant distribution uniformity in the upper portion of the gate electrode.

Thus, in a further embodiment, the ARC layer 338, shown in FIG. 3e, may not be removed and may further serve as an implantation protection layer in the drain/source implantation sequence. In this case, the ARC layer 338 may be provided with an appropriate thickness still meeting the optical requirements of the photolithography process. A further implantation protection layer (not shown) may be additionally deposited prior to the ARC layer 338 to provide the required ion blocking characteristic, if the ARC layer 338 may not be adapted to provide a sufficient ion blocking characteristic.

As a result, the CMOS device 400 as shown in FIG. 4 has a highly conductive gate electrode 467, 469, including the gate metal silicide region 463, 465 and a doped gate electrode portion 487, 489, in which the dopant concentration and distribution is adapted to reduce gate depletion and substantially suppress dopant penetration of the gate insulation layer 443, 445. In this way, extremely scaled CMOS transistors may be fabricated having a channel length of less than approximately 100 nm without unduly compromising the threshold voltage of the transistors. Thus, the present invention provides the potentiality for an aggressive scaling of narrow width transistor elements by using presently well-established manufacturing methods.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   depositing a first layer of semiconductor gate material comprising at least a first dopant at least above a first gate insulation layer formed above a first semiconductor region;
   depositing a second layer of semiconductor gate material comprising at least a second dopant other than said first dopant at least above a second gate insulation layer formed above a second semiconductor region; and
   patterning said first and second layer of semiconductor gate material to form first and second gate electrode structures, each of said first and second gate electrode structures having a gate length and a gate width, wherein:
      said gate length of said first and second gate electrodes is less than approximately 100 nm; and
      an aspect ratio of said gate width and said gate length of at least one of said first and second gate electrodes is less than 5.

2. The method of claim 1, wherein depositing said first and second layers of semiconductor material comprises:
   depositing the first layer of semiconductor material over said first and second gate insulation layers;
   removing the first layer of semiconductor material from above said second gate insulation layer; and
   depositing the second layer of semiconductor material over said second gate insulation layer and said first layer of semiconductor material above said first semiconductor region.

3. The method of claim 2, wherein:
   the first semiconductor region is one of N-doped and P-doped and said first dopant provides a doping that is inverse to said doping of the first semiconductor region; and
   the second semiconductor region is one of N-doped and P-doped and said second dopant provides a doping that is inverse to said doping of the second semiconductor region.

4. The method of claim 1, wherein said first dopant is an N-type dopant material and said second dopant is a P-type dopant material.

5. The method of claim 1, wherein said first dopant is a P-type dopant material and said second dopant is an N-type dopant material.

6. The method of claim 3, further comprising polishing the substrate after depositing said second layer of semiconductor material to remove said second layer of semiconductor material from said first layer of semiconductor material and form a substantially flat substrate surface.

7. The method of claim 1, wherein said first and second gate electrode structures extend in a gate width direction across said first and second semiconductor regions and further extend at least partially over a dielectric isolation structure disposed between and separating said first and second semiconductor regions.

8. The method of claim 6, wherein after performing said polishing, a thickness of said first and second layers of semiconductor material is at least as thick as a height of said first and second gate electrode structures.

9. The method of claim 1, wherein patterning said first and second layers of semiconductor gate material to form said first and second gate electrode structures comprises masking said first and second layers of semiconductor gate material and performing an etching process.

10. The method of claim 1, wherein said first and second layers of semiconductor material comprise silicon.

11. The method of claim 10, wherein at least one of said first and second layers of semiconductor material further comprise germanium.

12. The method of claim 10, wherein said first and second layers of semiconductor material comprise polysilicon.

13. The method of claim 1, wherein said first and second layers of semiconductor material are deposited by low pressure chemical vapor deposition.

14. The method of claim 1, wherein depositing said first layer of semiconductor material comprises adding precursor gas containing said first dopant.

15. The method of claim 1, wherein depositing said second layer of semiconductor material comprises adding precursor gas containing said second dopant.

16. A method of forming a CMOS device, comprising:
   providing a substrate comprising at least one N-type semiconductor region and at least one P-type semiconductor region surrounded and separated by dielectric isolation structures;
   forming a first gate insulation layer on said at least one N-type semiconductor region;
   forming a second gate insulation layer on said at least one P-type semiconductor region;
   depositing a first layer of semiconductor gate material comprising at least one P-dopant at least over said first gate insulation layer;
   depositing a second layer of semiconductor gate material comprising at least one N-dopant at least over said second gate insulation layer;
   patterning said first and second layer of semiconductor gate material second gate electrode structures, each of said first and second gate electrode structures having a gate length and a gate width, wherein:
      said gate length of said first and second gate electrode is less than approximately 100 nm; and
      an aspect ratio of said gate width and said gate length of at least one of said first and second gate electrodes is less than 5;
   forming first source and drain regions in said at least one N-type semiconductor region; and
   forming second source and drain regions in said at least one P-type semiconductor region.

17. The method of claim 16, wherein depositing said first and second layer of semiconductor material comprises:
   depositing the first layer of semiconductor material over said first and second gate insulation layer;
   removing the first layer of semiconductor material from said second gate insulation layer; and
   depositing the second layer of semiconductor material over said second gate insulation layer.

18. The method of claim 16, wherein said first and second gate electrode structures extend in a gate width direction across said first and second semiconductor regions and further extend at least partially over said dielectric isolation structure separating said first and second semiconductor regions.

19. The method of claim 17, wherein depositing said second layer of semiconductor material over said second gate insulation layer comprises:
- depositing said second layer of semiconductor material over said second gate insulation layer and said first layer of semiconductor material above said first semiconductor region; and
- polishing said semiconductor substrate to remove said second layer of semiconductor material from said first layer of semiconductor material and form a substantially flat substrate surface.

20. The method of claim 19, wherein after performing said polishing, a thickness of said first and second layers of semiconductor material is at least as thick as a height of said first and second gate electrodes structures.

21. The method of claim 16, wherein said first and second layers of semiconductor material comprise silicon and germanium.

22. The method of claim 16, wherein said N-dopant is incorporated by adding phosphine as a precursor gas in the deposition process.

23. The method of claim 16, wherein said P-dopant is incorporated by adding diborane as a precursor gas in the deposition process.

24. A method of forming a CMOS device, comprising:
- providing a substrate comprising at least one N-type semiconductor region and at least one P-type semiconductor region surrounded and separated by dielectric isolation structures;
- forming a first gate insulation layer on said at least one N-type semiconductor region;
- forming a second gate insulation layer on said at least one P-type semiconductor region;
- depositing a first layer of semiconductor gate material comprising at least one P-dopant over said first gate insulation layer and a second layer of semiconductor gate material comprising at least one N-dopant over said second gate insulation layer, wherein depositing said first and second layers of semiconductor gate material comprises:
  - depositing said first layer of semiconductor gate material over said first and second gate insulation layer;
  - removing said first layer of semiconductor gate material from said second gate insulation layer by performing an etching process, said etching process comprising a dry reactive ion etch of an upper portion of said first layer of semiconductor gate material and a wet etch of a lower portion of said first layer of semiconductor gate material;
  - depositing said first layer of semiconductor gate material over said second gate insulation layer and said first layer of semiconductor material above said first semiconductor region; and
  - polishing said semiconductor substrate to remove said second layer of semiconductor material from said first layer of semiconductor material and form a substantially flat substrate surface;
- patterning said first and second layer of semiconductor gate material to form first and second gate electrode structures, each of said first and second gate electrode structures having a gate length and a gate width, wherein:
  - said first and second gate electrode structures extend in a width direction across said first and second semiconductor regions and further extend at least partially over said dielectric isolation structure separating said first and second semiconductor regions;
  - said gate length of said first and second gate electrodes is less than approximately 100 nm; and
  - an aspect ratio of said gate width and said gate length of at least one of said first and second gate electrodes is less than 5;
- forming first source and drain regions in said at least one N-type semiconductor region; and
- forming second source and drain regions in said at least one P-type semiconductor region.

* * * * *

UNITED STATES PATENT AND TRADEMARK OFFICE
CERTIFICATE OF CORRECTION

PATENT NO.        : 7,419,867 B2                                    Page 1 of 1
APPLICATION NO.   : 11/154878
DATED             : September 2, 2008
INVENTOR(S)       : Karsten Wieczorek, Manfred Horstmann and Thomas Feudel It is certified that error appears in the above-identified patent and that said Letters Patent is hereby corrected as shown below:

Col. 14, line 41 (claim 16, line 17), after "gate material" insert -- to form first and --.

Col. 16, line 10 (claim 24, line 26), "said first layer" should be -- said second layer --.

Signed and Sealed this

Seventh Day of October, 2008

JON W. DUDAS
*Director of the United States Patent and Trademark Office*